(12) United States Patent
Kido et al.

(10) Patent No.: US 7,393,413 B2
(45) Date of Patent: Jul. 1, 2008

(54) COATING APPARATUS AND ORGANIC ELECTRONIC DEVICE FABRICATING METHOD

(75) Inventors: Junji Kido, Yonezawa (JP); Noritaka Ishiyama, Kawasaki (JP); Daigo Aoki, Tokyo-to (JP); Norikatsu Nakamura, Tokyo-to (JP)

(73) Assignees: Junji Kido, Yonezawa (JP); GMC Hillstone Co., Ltd., Mogami (JP); Dai Nippon Printing Co., Ltd., Tokyo (JP)

( * ) Notice: Subject to any disclaimer, the term of this patent is extended or adjusted under 35 U.S.C. 154(b) by 3 days.

(21) Appl. No.: 10/547,368

(22) PCT Filed: Mar. 5, 2004

(86) PCT No.: PCT/JP2004/002802

§ 371 (c)(1),
(2), (4) Date: Aug. 29, 2005

(87) PCT Pub. No.: WO2004/078362

PCT Pub. Date: Sep. 16, 2004

(65) Prior Publication Data

US 2006/0162650 A1 Jul. 27, 2006

(30) Foreign Application Priority Data

Mar. 7, 2003 (JP) ............................. 2003-062438
Mar. 17, 2003 (JP) ............................. 2003-071701

(51) Int. Cl.
*B05C 5/00* (2006.01)
*B05C 13/02* (2006.01)
*B05C 3/02* (2006.01)
*B05B 3/00* (2006.01)
*H02K 41/00* (2006.01)

(52) U.S. Cl. ............... 118/305; 118/300; 118/323; 118/410; 310/12

(58) Field of Classification Search ............... 118/300, 118/313, 305, 46, 323, 410–414; 310/12–14; 355/53, 72; 318/135; 347/20, 40, 47
See application file for complete search history.

(56) References Cited

U.S. PATENT DOCUMENTS

| 6,040,642 | A | * | 3/2000 | Ishiyama | ............... 310/12 |
| 2003/0102723 | A1 | * | 6/2003 | Korenaga | ............... 310/12 |
| 2003/0165629 | A1 | * | 9/2003 | Sakurada | ............... 427/421 |
| 2003/0217694 | A1 | * | 11/2003 | Korenaga | ............... 118/500 |

FOREIGN PATENT DOCUMENTS

| JP | A-2001-008430 | 1/2001 |
| JP | A-2001-190088 | 7/2001 |
| JP | A-2003-022892 | 1/2003 |
| KR | 2002-0009483 | 2/2002 |

* cited by examiner

*Primary Examiner*—Yewebdar Tadesse
(74) *Attorney, Agent, or Firm*—Oliff & Berridge, PLC

(57) ABSTRACT

A coating apparatus 10 includes a base 11, a substrate support stage unit 2 mounted on the base 11 and capable of fixedly supporting a substrate 1, a coating unit 3 mounted on the base 11 and capable of discharging a coating material onto a substrate 1 fixedly supported on the substrate support stage unit 2, and a motor unit 4 for driving at least either the substrate support stage unit 2 or the coating unit 3 for sliding on the base 11. The motor unit 3 has a stator assembly 22 on the base 11. The stator assembly 22 includes a plurality of magnets 31 linearly arranged such that opposite magnetic polarities of the magnets alternately change, and a pair of magnet holding members 37 and 38 for linearly pressing the magnets 31 together from both the ends of the magnets.

17 Claims, 5 Drawing Sheets

COATING APPARATUS AND ORGANIC ELECTRONIC DEVICE FABRICATING METHOD

TECHNICAL FIELD

The present invention relates to a coating apparatus coating a surface of a substrate with an organic electronic material, typically, organic electroluminescent materials (EL materials), organic materials for forming thin-film transistors or materials for forming solar cells, and an organic semiconductor device fabricating method using the same coating apparatus. More specifically, the present invention relates to a coating apparatus capable of forming an organic film having a uniform thickness and an organic electronic device fabricating method using the same coating apparatus.

BACKGROUND ART

Flat panel displays (FPDs) have been developed and commercialized and large, heavy displays employing a CRT (cathode-ray tube) have been replaced with FPDs in recent years. Among the widely used FPDs are liquid crystal displays (LCDs) applied to various portable electronic devices, notebook-size personal computers and miniature television sets. Plasma display panels (PDPs), as well as LCDs, have been developed and commercialized.

An EL display is one type of FPD. Efforts for developing EL displays began a relatively long time ago. However, EL displays have problems in displaying full-color pictures, luminance and short product life and hence have not been widely used.

A thin film of an inorganic compound (referred to as "inorganic compound film") has been used as a luminescent layer, namely, an EL layer, for an organic EL device such as an EL display. An EL device employing a thin film of an inorganic compound needs a high driving voltage, has a low luminous efficiency and can display pictures in low luminance. Organic compound thin films capable of being driven by a low driving voltage and having a high luminous efficiency have become used as luminescent layers for EL devices in recent years. The organic EL device employing an organic compound thin film (the organic electroluminescent device) has a short product life. R&D activities have been made to develop materials for forming long-life organic luminescent layers. Organic EL devices practically competitive with LCDs have been developed.

Generally, a vacuum evaporation process has been used for forming an EL layer consisting of an organic luminescent layer, a carrier transport layer, which is used when necessary, and a carrier injection layer. However, organic compounds that can be used for vacuum evaporation are limited to those of a low molecular weight. In the organic EL device having an organic layer of an organic compound having a low molecular weight, crystallization or cohesion proceeds in the organic layer with time. Consequently, the device deteriorates and the life of the device is shortened greatly. An organic EL device provided with a luminescent layer formed of an organic compound having a high molecular weight, namely, an organic EL material, has been proposed. An organic EL material prepared by dispersing a carrier transport organic compound having a low molecular weight and a luminescent compound in an inactive polymer binder, and a polymerizing method of incorporating vinyl radicals into a carrier transport organic compound having a low molecular weight for polymerization have been proposed.

The EL layer of an organic EL material is formed by a wet coating process. A spin-coating process is a commonly used wet coating process. The spin-coating process is inefficient in solution usage and is not suitable for coating a surface of a large area with a film. Generally, the thickness of dry organic films serving as EL layers is in the range of 10 to about 200 nm. Therefore, the wet coating process for forming an organic film needs to use a coating solution having a very low concentration and a low viscosity. Therefore, a wet organic film formed by the wet coating process is highly fluidic and an organic film having an irregular thickness is liable to be formed. Since the organic film is very thin, even a small thickness deviation can be a large thickness error and it is highly possible that the small thickness deviation causes irregular luminescence. Therefore, when an organic film is formed by the spin-coating process, even a trace of a drop of the coating solution can cause irregular luminescence. It is very difficult for the spin-coating process to form a uniform film on a substrate of a size not smaller than 150 mm×150 mm without assistance.

Known wet coating processes other than the spin coating process include a die coating process, a bar coating process, a blade coating process, a roll coating process and bead coating process. Use of the die coating process for forming a film is mentioned, for example, in Patent documents 1 and 2.

A coating apparatus capable of carrying out the die coating process forms an organic film on a substrate by jetting a coating solution through the exit of a die placed on the substrate while the die is sliding along a surface of the substrate in a predetermined direction.

This known coating apparatus can form an organic film having a uniform thickness by jetting the coating solution through the exit of the die at a constant jetting rate.

Another coating apparatus capable of carrying out the die coating process disclosed in, for example, Patent document 3, moves a substrate during a coating operation.

This known coating apparatus shown in FIG. 7 includes a glass plate feed unit 101, namely, a feed means for feeding glass plates 100, a precision table 102 provided with air jetting holes, namely, a substrate lifting means for lifting up the glass plate 100 by air pressure, a glass substrate pushing block 104 provided with a precision linear motor 103, namely, a substrate moving means for moving the glass plate 100 at a predetermined coating speed, a die head 106 operated by a head lifting cylinder actuator 105, namely, a coating means for coating the glass plate 100 with a coating solution, a coating solution supply pump 107 and a coating tank 108, namely, coating solution supply means for supplying the coating solution to the die head 106, and a glass plate delivery unit 109, namely, a substrate delivery means for delivering the coated glass plate 100.

Patent document 1: JP 2003-10755 A (FIG. 1)
Patent document 2: JP 2002-153795 A (FIG. 1)
Patent document 3: JP 2002-346463 A ([0013], FIG. 1)

The foregoing known coating apparatus is able to form an organic film having a uniform thickness if the die or the substrate is slid at a fixed sliding speed during the coating operation. In some cases, the die cannot be slid at a fixed sliding speed by the motor, a principal component of a sliding means. If the die or the substrate is not moved at a satisfactorily constant speed, i.e., if the die or the substrate is moved at an irregular speed, the surface of the substrate is coated irregularly with the coating solution and, consequently, an organic film having an irregular thickness is formed. Since the EL layer, in particular, is very thin, small thickness irregularities can be large thickness errors, and large thickness errors are capable of causing irregular luminescence. The die needs to slide at a high sliding speed to increase the throughput of the coating process. It is expected that increase in the sliding speed intensifies the adverse effect of irregular speed. It is expected that the wider the surface to be coated, the greater is the adverse effect of irregular speed.

DISCLOSURE OF THE INVENTION

The present invention has been made in view of the foregoing problems and it is therefore an object of the present invention to provide a coating apparatus capable of forming an EL layer having a uniform thickness.

The present invention provides a coating apparatus including: a base; a substrate support stage unit mounted on the base and capable of fixedly supporting a substrate; a coating unit mounted on the base and capable of discharging a coating material onto a substrate fixedly supported on the substrate support stage unit; and a motor unit for driving at least either of the substrate support stage unit and the coating unit for sliding on the base; wherein the motor unit includes a plurality of magnets linearly arranged such that opposite magnetic polarities of the magnets alternately change, and a pair of magnet holding members for linearly pressing the magnets together from both the ends of the magnets.

According to the present invention, the motor unit includes a linear servomotor formed by linearly arranging the plurality of magnets such that opposite magnetic polarities alternate and the adjacent magnets are in close contact with each other. Therefore, no gaps are formed between the adjacent magnets and hence the substrate support stage unit and the coating unit can be moved at a satisfactorily constant speed. Since the substrate support stage unit and the coating unit slides at a fixed speed, an organic layer, namely, an EL layer, having a uniform thickness can be formed on the substrate by discharging an organic EL material from the coating unit sliding relative to the substrate support stage unit onto the substrate.

In the coating apparatus according to the present invention, the motor unit includes a stator assembly fixedly mounted on the base, and a slider assembly that slides in opposite directions along the stator assembly, and the plurality of magnets are included in the stator assembly.

The coating apparatus according to the present invention is characterized in that the slider assembly is internally provided with a plurality of coils.

Thus the coating unit can be slid relative to the substrate support stage unit exactly and at a satisfactorily constant speed.

The coating apparatus according to the present invention is characterized in that each of the magnets is a cylindrical magnet having a bore, and a nonmagnetic center bar is fitted in the bores of the cylindrical magnets.

The plurality of magnets can be linearly arranged by successively putting the plurality of magnets on the center bar, which facilitates assembling work.

The coating apparatus according to the present invention is characterized in that the plurality of magnets are held in a nonmagnetic cylindrical member.

Thus the plurality of magnets need simply to be put on the center bar and to be inserted in the cylindrical member, which further facilitates assembling work.

The coating apparatus according to the present invention is characterized in that the magnets are formed in an annular shape, and the cylindrical member is a cylindrical pipe having an inside surface in close contact with the outside surfaces of the annular magnets.

Thus the plurality of magnets are restrained from axial displacement and, therefore, the constancy of the sliding speed of the substrate support stage unit and the coating unit can be further ensured and the organic layer, namely, the EL layer, can be formed in a further uniform thickness.

The coating apparatus according to the present invention is characterized in that the pair of magnet holding members are a retaining member placed on a first end part of the center bar in contact with the adjacent magnet, and a pressing member placed on a second end part opposite the first end part of the center bar and pressing the adjacent magnet toward the retaining member.

The coating apparatus according to the present invention is characterized in that the pressing member is detachably attached to the second end part of the center bar.

Thus the coating apparatus is simple in construction.

The coating apparatus according to the present invention is characterized in that the magnets are permanent magnets of a magnetic material, such as a rare-earth metal or ferrite.

The coating apparatus according to the present invention is characterized in that the coating unit is provided with an ink-jet head, a dispenser nozzle, a die head or a doctor knife.

The coating apparatus according to the present invention is characterized in that the plurality of magnets are surrounded by a nonmagnetic cylindrical member, the retaining member is placed on the first end part of the center bar corresponding to a first end of the cylindrical member, and the pressing member is placed detachably on the second end part of the center bar corresponding to a second end opposite the first end of the cylindrical member.

The coating apparatus according to the present invention is characterized in that the coating material is an organic semiconductor material, such as an organic electroluminescent material, an organic material for forming thin-film transistors or a material for forming solar cells.

An organic electronic device fabricating method according to the present invention to be carried out by a coating apparatus including: a base; a substrate support stage unit mounted on the base and capable of fixedly supporting a substrate; a coating unit mounted on the base and capable of discharging a coating material onto a substrate fixedly supported on the substrate support stage unit; and a motor unit, for driving at least either of the substrate support stage unit or the coating unit for sliding on the base, the motor unit including a plurality of magnets linearly arranged such that opposite magnetic polarities of the magnets alternately change, and a pair of magnet holding members for linearly pressing the magnets together from both the ends of the magnets, the method comprising the steps of forming an organic layer by coating the substrate with a coating material by the coating apparatus, and fabricating an organic electronic device.

The organic electronic device fabricating method according to the present invention is characterized in that the organic electronic device is an organic semiconductor device, such as an organic electroluminescence device, an organic thin-film transistor or a solar cell.

The organic electronic device fabricating method according to the present invention is characterized in that a thickness error in the organic layer is 2% or below.

The organic electronic device fabricating method according to the present invention is characterized in that the organic layer has a thickness in the range of 10 to 1000 nm.

BEST MODE FOR CARRYING OUT THE INVENTION

A coating apparatus according to the present invention will be described with reference to the accompanying drawings.

Figure 1:
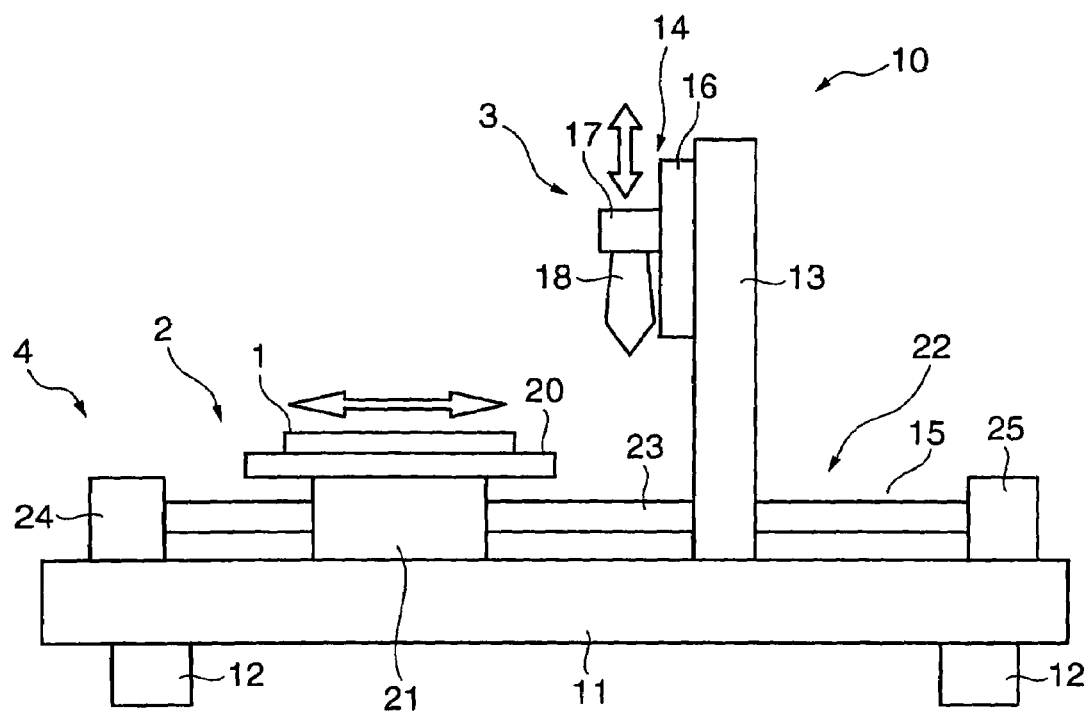
FIG. 1 is a schematic view of a coating apparatus in a first embodiment according to the present invention.

FIG. 1 shows a coating apparatus 10 according to the present invention by way of example in a schematic view.

Figure 6:
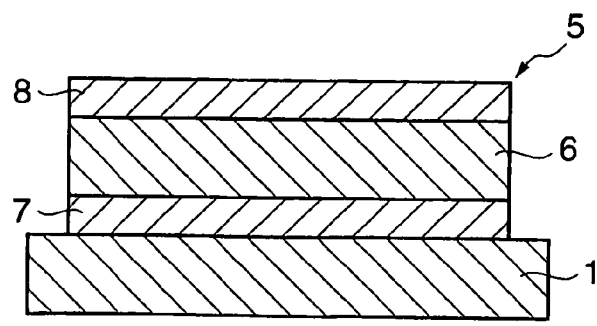
FIG. 6 is a typical sectional view of an organic EL device.
Figure 7:
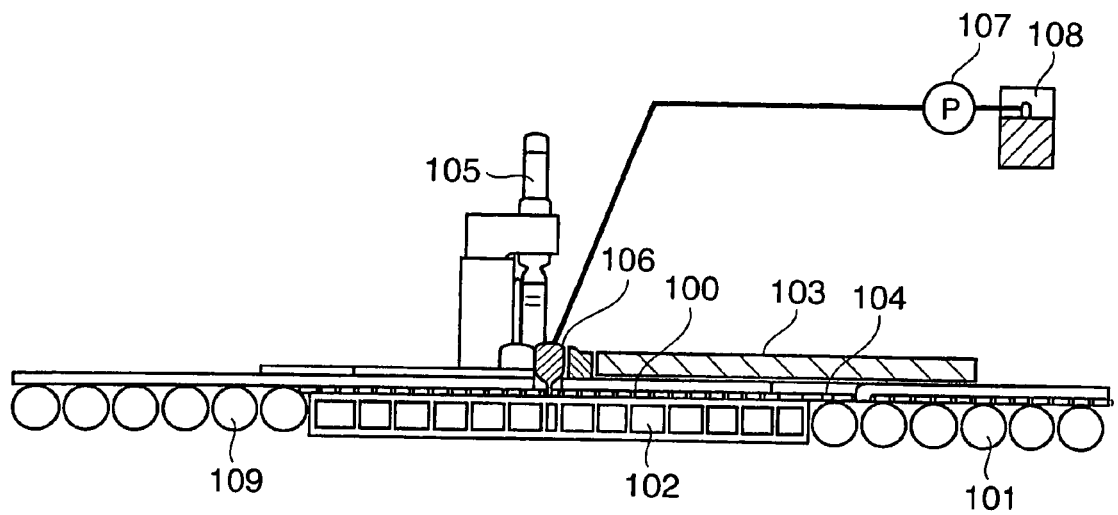
FIG. 7 is a side elevation of a conventional coating apparatus.

Referring to FIG. 1, the coating apparatus 10 includes a base 11, a substrate support stage unit 2 mounted on the base 11 and capable of fixedly supporting a substrate 1, a coating unit 3 mounted on the base 11 and capable of discharging an organic electronic material (a coating material) onto the substrate 1 fixedly supported on the substrate support stage unit 2, and a motor unit 4 for driving both or at least either of the substrate support stage unit 2 and the coating unit 3 for sliding on the base 11. The coating apparatus coats the substrate 1 with the organic electronic material to form an EL layer 6 for an organic EL device 5 as shown in FIG. 6.

The organic electronic material employed in the present invention may be any one of organic materials used for forming generally known organic electronic devices. For example, suitable organic electronic materials are organic semiconductor materials including organic EL materials, materials for forming organic thin-film transistors and materials for forming solar cells. In this embodiment, it is supposed that the organic semiconductor material is an organic EL material. The coating apparatus of the present invention is capable of forming, for example, the EL layer 6 of the organic EL device 5 as shown in FIG. 6 by spreading an organic EL material on the substrate 1.

The organic EL device 5 having generally known construction is formed by sequentially forming a first electrode layer 7, the EL layer 6 and a second electrode layer 8 on the substrate 1. If the substrate 1 has the same function as that of the first electrode layer 7, the EL layer 6 is formed on the substrate 1, and another substrate serving also as the second electrode layer 8 is laminated to the EL layer 6.

The substrate 1 may be a generally known one for the organic EL device 5. There is no particular restriction on the substrate 1, provided that the substrate 1 is able to strengthen the organic EL device 5. If the substrate 1 has a strength needed by the electrode layer 7, the substrate 1 may serve also as the first electrode layer 7.

The material of the substrate 1 may be a hard material or a flexible material. The quality of the material of the substrate 1 is dependent on the use. Possible materials for forming the substrate 1 are, for example, glass, quartz, polyethylenes polypropylenes, polyethylene terephthalates, polymethacrylates, polymethyl methacrylates, polymethyl acrylates, polyesters and polycarbonates. When light emitted by the EL layer 6, namely, luminescent layer, is to be transmitted by the substrate, the substrate 1 must be formed of a transparent material, such as glass. The material of the substrate 1 does not need to be limited to a transparent material when light emitted by the EL layer 6 is to be emitted to a side opposite the side of the substrate 1. The substrate 1 may be either a sheet or a web. More concretely, the substrate 1 has the shape of, for example, a card, a film, a disk or a chip.

The first electrode layer 7 and the second electrode layer 8 are thin films formed by, for example, a vacuum sputtering process, a vacuum evaporation process or a coating process. Although there are not any limitative conditions for the method of forming the electrode layers 7 and 8, the electrode layers 7 and 8 may be formed by a coating process using the coating apparatus 10 of the present invention.

Whether the first electrode layer 7 and the second electrode layer 8 are transparent or not is dependent on the side on which the light emitted by the luminescent layer is received. The first electrode layer 7 must be formed of a transparent material when the light emitted by the luminescent layer is to be received on the side of the substrate, but the first electrode layer 7 does not need to be transparent when the light emitted by the luminescent layer is to be received on the side opposite the side of the substrate. Either of the first electrode layer 7 and the second electrode layer 8 may be an anode. Generally, the first electrode layer 7 is used as an anode.

When the first electrode layer 7 is to be used as an anode, suitable materials are, for example, metals having a large work function, such as indium tin oxide (ITO), indium oxide and gold, and conductive polymers, such as aniline polymers, acetylene polymers, polyalkylthiophene derivatives and polysilane derivatives.

When the second electrode layer 8 is to be used as a cathode, suitable materials are, for example, metals including magnesium alloys, such as MgAg, aluminum alloys, such as AlLi, AlCa and AlMg, alkaline metals, such as Li and Ca, and metals having a small work function, such as alloys of alkaline metals.

The respective thicknesses of the first electrode layer 7 and the second electrode layer 8 are dependent on materials forming the electrode layers 7 and 8. Preferably, the respective thicknesses of the first electrode layer 7 and the second electrode layer 8 are, for example, in the range of 10 to about 1000 nm.

The EL layer 6 is a single luminescent layer or a laminated layer of two or more organic layers including a luminescent layer; that is, the EL layer 6 is an organic layer including at least a luminescent layer. The EL layer includes at least one organic layer.

The component organic layer of the EL layer 6 is a thin film formed by the coating apparatus of the present invention. Since solvents make it difficult to laminate many layers, the EL layer 6 consists of a single organic layer or two organic layers in most cases. The EL layer 6 of multilayer construction having three or more layers of properly selected organic materials can be formed.

Organic layers, other than the luminescent layer, of the EL layer 6 are carrier injection layers, such as a hole injection layer and electron injection layer. Further possible organic layers are carrier transport layers, such as a hole transport layer and an electron transport layer. In most cases, the hole transport layer or the electron transport layer are formed integrally with a carrier injection layer by providing a carrier injection layer with a carrier transport function. Other organic layers are a hole blocking layer and an electron blocking layer for blocking penetrating carriers to make carriers recombine efficiently.

Preferably, the respective thicknesses of the organic layers are determined properly taking into consideration the type of the organic EL layer and the materials of the organic layers. If the organic EL layer is excessively thick, a high voltage is needed to obtain a fixed light output and efficiency is low. If the organic EL layer is excessively thin, pinholes are formed in the organic EL layer and the organic EL layer is unable to emit light in a sufficiently high luminance when an electric field is applied to the organic EL layer. Therefore, it is preferable that the respective thicknesses of the organic layers are, for example, in the range of 5 nm to about 10 μm.

An organic EL material for forming the EL layer 6, such as a luminescent material for forming the essential luminescent layer (organic layer) of the EL layer 6, may be any one of materials generally used for forming luminescent layers. Suitable organic EL materials are, for example, luminescent dyes, luminescent metal complexes and luminescent polymers.

Suitable luminescent dyes are, for example, cyclopentadiene derivatives, tetraphenyl butadiene derivatives, triphenyl amine derivatives, oxadiazole derivatives, pyrazoloquinoline derivatives, distilbenzene derivatives, distilallylene derivatives, silole derivatives, thiophene cyclic compounds, pyridine cyclic compounds, perinone derivatives, perylene derivatives, oligothiphen derivatives, trifumanylamine derivatives, oxadiazole dimers and pyrazoline dimers.

Suitable-luminescent metal complexes are, for example, metal complexes having a metal, such as Al, Zn or Be or a rare-earth metal, such as Tb, Eu or Dy, as a central metal and having an oxadiazole, thiazole, phenylpyridine, phenylbenzoimidazole or quinoline structure as a ligand, such as aluminum quinolinol complexes, beryllium benzoquinolinol complexes, zinc benzoxazole complexes, zinc benzothiazole complexes, zinc azomethyl complexes, porphyrin zinc complexes and europium complexes.

Suitable luminescent polymers are, for example, polyparaphenylenevinylene derivatives, polythiophene derivatives, polyparaphenylene derivatives, polysilane derivatives, polyacetylene derivatives, polyvinyl carbazoles, polyfluorenone derivatives, polyfluorene derivatives, polyquinoxaline derivatives and copolymers of those polymers.

The luminescent layer may contain an additive, such as a dopant, to improve luminous efficiency or to change emission wavelength. Suitable dopanets are, for example, perylene derivatives, coumarin derivatives, rubrene derivatives, quinacridone derivatives, squalium derivatives, porphyrin derivatives, styryl dyes, tetracene derivatives, pyrazoline derivatives, decacyclene, phenoxazone, quinoxaline derivatives, carbazole derivatives and fluorene derivatives.

Suitable materials for forming the hole injection layer (organic EL materials) are, for example, the compounds mentioned above as suitable luminescent materials for the luminescent layer, phenylamines, starburst amines, phthalocyanines, oxides including vanadium oxide, molybdenum oxide, ruthenium oxide and aluminum oxide, amorphous carbon, and derivatives of polyaniline and polythiophene.

Suitable materials for forming the electron injection layer (organic EL materials) are, for example, the compounds mentioned above as suitable luminescent materials for the luminescent layer, aluminum, lithium fluoride, strontium, magnesium oxide, magnesium fluoride, strontium fluoride, calcium fluoride, barium fluoride, aluminum oxide, strontium oxide, calcium, sodium polymethylmethacrylate polystyrene sulfonate, alkaline metals including lithium, cesium and cesium fluoride, halogenides of alkaline metals, and organic complexes of alkaline metals.

The organic layer may contain a luminescent material, such as an oligomer or a dendorimer, and a charge transport injection material.

A thin film serving as the organic layer is formed on the substrate 1 by spreading an organic EL liquid prepared by dissolving or dispersing an organic EL material in a solvent, such as toluene, chloroform, dichloromethane, tetrahydrofuran or dioxane, on the substrate 1 by the coating apparatus 10 of the present invention. The organic EL liquid prepared by dissolving or dispersing an organic EL material in a solvent will be referred to as "organic EL material" for convenience.

Figure 2:
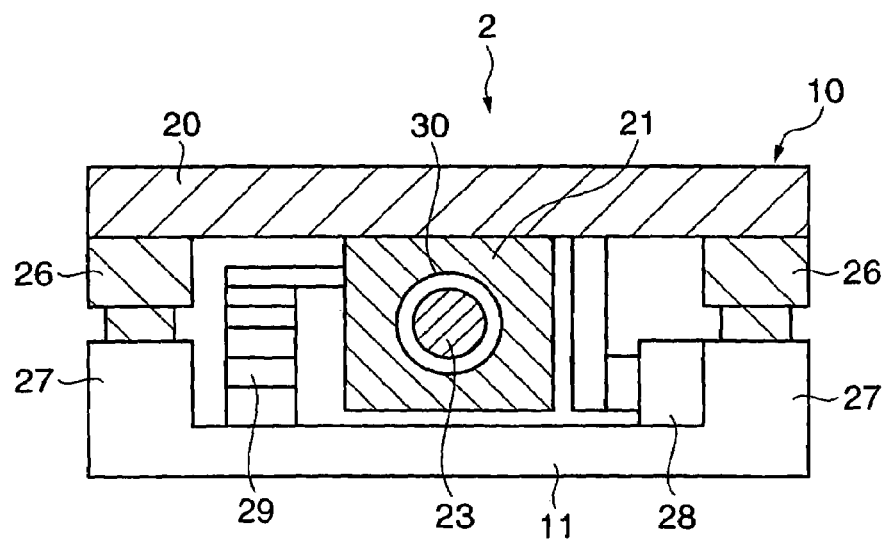
FIG. 2 is a schematic sectional view of a coating apparatus in a second embodiment according to the present invention.

Referring to FIGS. 1 and 2, the coating apparatus 10 of the present invention has the substrate support stage unit 2, the coating unit 3 and the motor unit 4. It is a feature of the present invention that the motor unit 4 includes a linear servomotor formed by linearly arranging a plurality of magnets such that opposite magnetic polarities of the magnets alternately change, and the magnets are pressed together so that the adjacent magnets are in close contact with each other.

In the coating apparatus 10, the motor unit 4 including the linear servomotor slides both or either of the substrate support stage unit 2 and the coating unit 3 and, at the same time, the coating unit 3 discharges the organic EL material onto the substrate 1. There are three driving modes in which the linear servomotor operates; (1) a first driving mode for sliding both the substrate support stage unit 2 and the coating unit 3, (2) a second driving mode for sliding only the substrate support stage unit 2 and (3) a third driving mode for sliding only the coating unit 3. Since sliding mechanisms for those driving modes are similar, description of the coating apparatus 10 will be made on an assumption that only the substrate support stage unit 2 is driven for sliding.

The base 11 of the coating apparatus 10 has legs 12. The legs 12 support the base 11 such that the upper surface of the base 11 is horizontal. The substrate support stage unit 2, the coating unit 3 and the motor unit 4 including the linear servomotor are mounted on the base 11.

A post 13 is set upright on the base 11. The coating unit 3 is held by a moving mechanism 14 on an upper part of the post 13 above a path 15. The substrate support stage unit 2 supporting the substrate 1 slides along the path 15.

The moving mechanism 14 includes a vertical moving unit 16 and a horizontal moving unit 17. The vertical moving unit 16 moves the coating unit 3 vertically, i.e., in directions substantially perpendicular to the upper surface of the base 11. The horizontal moving unit 17 moves the coating unit 3 horizontally, i.e., in directions perpendicular to a perpendicular to the vertical direction and perpendicular to the sliding directions of the substrate support stage unit 2. The moving mechanism 14 is able to set the coating unit 3 at a desired position for discharging the organic EL material.

The coating unit 3 is provided with a nozzle 18 through which the organic EL material is discharged. Preferably, the coating unit is provided with an ink-jet head, a dispenser nozzle, a die head or a knife.

The coating unit 3 is connected to a material supplying device, not shown. The material supplying device supplies the organic EL material to be discharged through the nozzle 18. The material supplying device may be a pressure supplying device or a pump, such as a gear pump, a diaphragm pump or a plunger pump. When the organic EL material is applied to the substrate 1 by the material supplying device, the supply rate of the material supplying device may be adjusted, when the supply rate is adjustable, to discharge the organic EL material through the nozzle 18 at a fixed discharge rate onto the substrate 1. A flow control valve, not shown, such as a solenoid valve or a pilot valve, may be disposed below the material supply device with respect to the flowing direction of the organic EL material to discharge the organic EL material at a fixed discharge rate through the nozzle 18 onto the substrate 1.

The substrate 1 is detachably fixed to a table 20 included in the substrate support stage unit 2. The substrate 1 may be fixed to the table 20 by any fixing means, provided that the organic EL material can be discharged onto and can be spread on one of the surfaces of the substrate 1. The table 20 is attached to a moving member 21 included in the motor unit 4 including the linear servomotor.

The linear servomotor included in the motor unit 4 includes a stator assembly 22 fixed to the base 11 and a moving member 21 that slides in opposite directions along the stator assembly 22.

The stator assembly 22 includes a cylindrical guide assembly 23 for guiding the sliding moving member 21, and brackets 24 and 25 supporting the opposite ends of the guide assembly 23 and fixed to the base 11. The brackets 24 and 25 are detachably fixed to optional parts of the base 11, such as opposite end parts of the base 11, with threaded members, such as bolts. The brackets 24 and 25 support the guide assembly 23 at a predetermined position above the upper surface of the base 11.

Opposite end parts of the guide assembly 23 are detachably attached to the brackets 24 and 25 opposite to each other. The guide assembly 23 may be attached to the brackets 24 and 25 by any suitable attaching means, provided that the guide assembly 23 will not be caused to move by the sliding moving member 21. The attaching means may be, for example, a screw mechanism or an interlocking mechanism. The guide assembly 23 may be attached to the brackets 24 and 25 after fixing the brackets 24 and 25 to the base 11. Preferably, the brackets 24 and 25 are attached to the base 11 after attaching the guide assembly 23 to the brackets 24 and 25.

A guide supporting member 27 extends near the base 11 along the sliding directions of the substrate support stage unit 2. As shown in FIG. 2, guide members 26 for guiding the table 20 of the substrate support stage unit 2 for sliding are supported on the guide supporting member 27.

An encoder 28, namely, a detecting means for detecting the position of the substrate 1 (or the substrate support stage unit 2), may be placed on the base 11. Indicated at 29 in FIG. 2 is a cable bearer for protecting cables and such connected to the moving member 21.

The moving member 21 has the shape of a rectangular box as shown in FIGS. 1 and 2. A longitudinal through hole 30 is formed in a central part of the moving member 21. The diameter of the through hole 30 is slightly greater than the outside diameter of the guide assembly 23. The guide assembly 23 is passed through the through hole 30 to support the moving member 21 slidably thereon. The coating unit 3 (the nozzle 18) is disposed above a part of the path 15 along which the moving member 21 slides. The position of the coating unit 3 is adjustable.

The table 20 of the substrate support stage unit 2 is detachably attached to the upper surface of the moving member 21. More specifically, the table 20 is attached to the moving member 21 such that the upper surface, to be coated with a film, of the substrate 1 fixed to the table 20 is substantially parallel to a horizontal plane containing, for example, the upper surface of the base 11.

Figure 3:
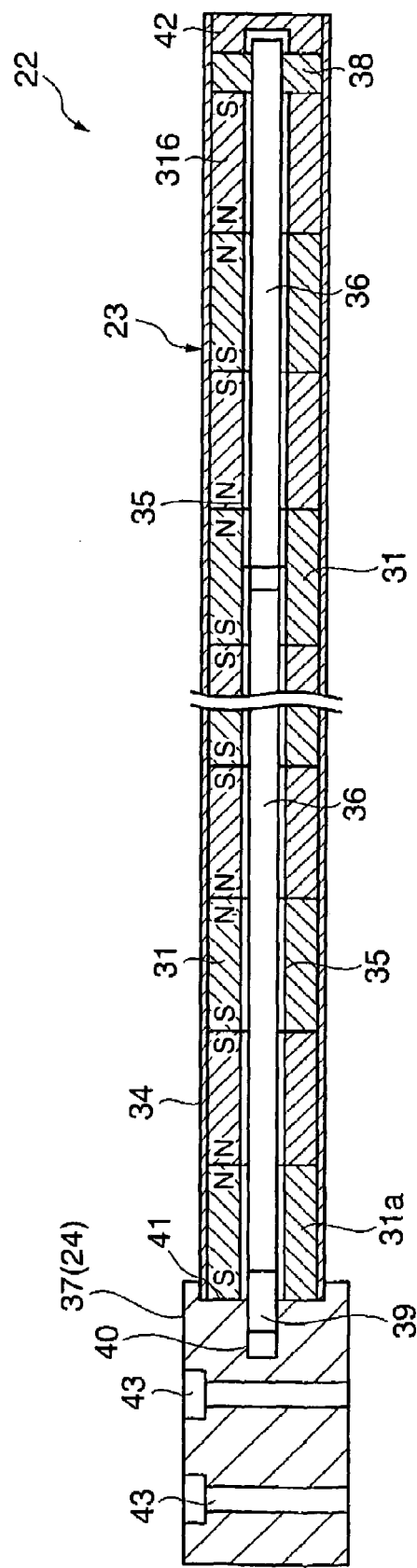
FIG. 3 is a schematic sectional view of a stator assembly included in a coating apparatus according to the present invention.
Figure 4:
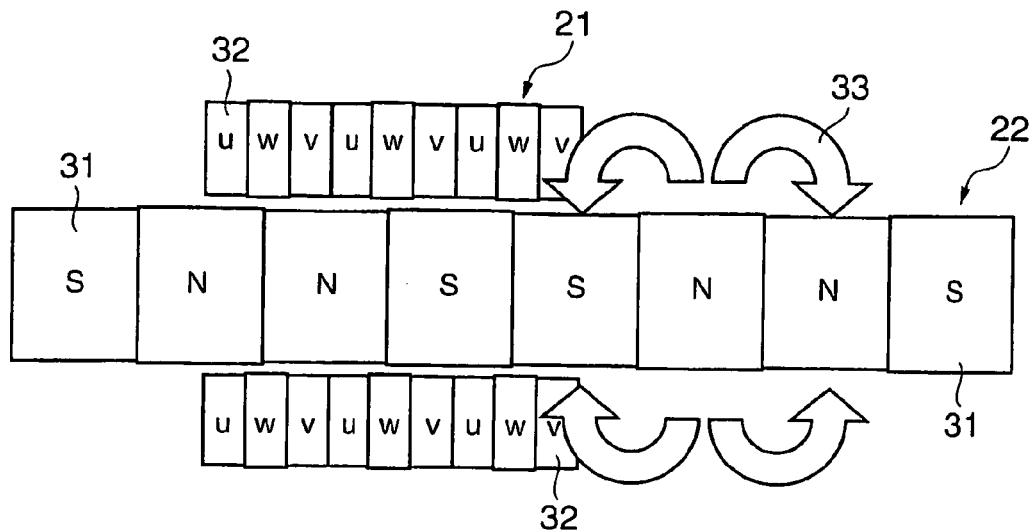
FIG. 4 is a view of assistance in explaining the principle of a linear servomotor according to the present invention.

Either of the stator assembly 22 and the moving member 21 is provided with permanent magnets (magnets) 31. In this embodiment, it is supposed that stator assembly 22 is provided with the permanent magnets 31. As shown in FIGS. 3 and 4, the permanent magnets 31 are arranged linearly contiguously such that opposite magnetic polarities of the magnets 31 alternately change, i.e., the N poles of the adjacent permanent magnets 31 are opposed to each other and the S poles of the adjacent permanent magnets 31 are opposed to each other. The moving member 21, in this embodiment, is provided with a plurality of coils 32. A current of a proper frequency and a proper phase is supplied to the coils 32 to create a moving magnetic field 33. Then, the moving member 21 slides as the moving magnetic field 33 moves. Needless to say, the stator assembly 22 may be provided with the plurality of coils 32 and the moving member 21 may be provided with the plurality of permanent magnets 31 to slide the moving member 21.

Figure 5A:
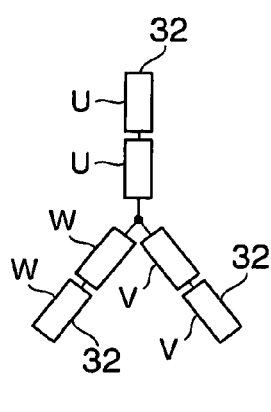
FIGS. 5A to 5C are views of assistance in explaining methods of connecting coils of linear servomotors.
Figure 5B:
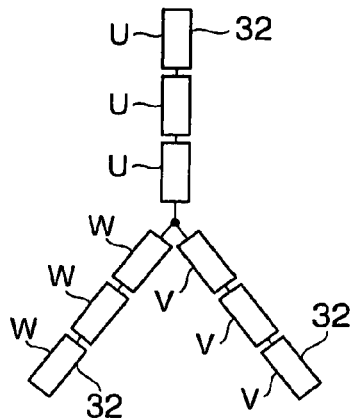
Figure 5C:
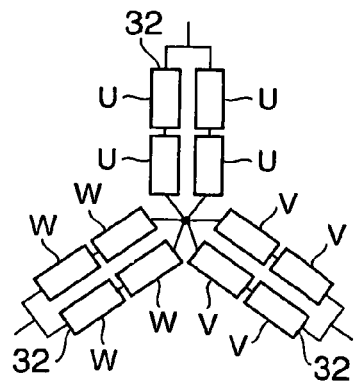

The coils 32 are disposed so as to surround the through hole 30 of the moving member 21. The coils 32 are divided into groups of three phases, namely, U, V and W phases. The groups of the U, V and W phases are arranged successively. For example, as shown in FIGS. 5A to 5C, the coils 32 of the U, V and W phases are connected and currents are supplied to the coils 32 of the U, V and W phases, respectively. The moving magnetic field 33 created by supplying currents of the U, V and W phases to the coils 32 varies according to the phase of the current and moves in one direction along the row of the coils 32.

As shown in FIGS. 3 and 4, the guide assembly 23 includes the plurality of permanent magnets 31 arranged such that the respective polarities of the adjacent permanent magnets 31 are opposite to each other. Magnet holding members 37 and 38 disposed at the opposite ends of the row of the permanent magnets 31 press the permanent magnets 31 together so that the adjacent permanent magnets 31 are in close contact with each other.

The guide assembly 23 includes, for example, the permanent magnets 31 of the same cylindrical shape, a nonmagnetic tubular member 34 holding the permanent magnets 31, a nonmagnetic center bar 36 inserted in the bores 35 of the permanent magnets 31, the magnet holding member 37 serving as a bearing member placed on one of the opposite ends of the center bar 36, and the magnet holding member 38 serving as a pressing member placed on the other end of the center bar 36 and pressing the permanent magnets 31 toward the magnet holding member 37. The pair of magnet holding members 37 and 38 press the permanent magnets 31.

The permanent magnets 31 have the shape of a circular or polygonal tube. Preferably, the permanent magnets 31 have the shape of a circular cylinder, namely, an annular shape. The permanent magnets 31 may be formed of any one of materials suitable for forming the members of the linear servomotor included in the motor unit 4. Preferably, the permanent magnets 31 are made of a rare-earth metal capable of creating a magnetic field having a high magnetic flux density or a ferrite material.

The shape of the tubular member 34 is dependent on that of the permanent magnets 31. If the permanent magnets 31 are formed in the shape of a ring, the tubular member 34 is a cylindrical pipe.

Preferably, the inside diameter of the cylindrical pipe serving as the tubular member 34 is determined so that the permanent magnets 31 inserted into the tubular member 34 may be in close or substantially contact with the inside surface of the tubular member 34.

Preferably, the wall of the tubular member 34 has the smallest possible thickness in order not to reduce the intensity of the moving magnetic field 33 because the moving member 21 is mounted outside the tubular member 34. For example, the wall thickness of the tubular member 34 is on the order of 1 mm.

The tubular member 34 may be formed in an optional length, provided that the predetermined number of the permanent magnets 31 can be axially successively held in the tubular member 34.

The center bar 36 is passed through the bores 35 of the permanent magnets 31. The center bar 36 is formed in a shape conforming to that of the bore 35 of the permanent magnets 31. For example, the center bar 36 may be a bar having a circular cross section or may be, as shown in the drawing, a circular cylinder.

When the inside diameter of the tubular member 34 meets the above-mentioned condition, there is not any particular restrictions on the outside diameter of the center bar 36. Preferably, the outside diameter of the center bar 36 is determined so that the outside surface of the center bar 36 is in contact or nearly in contact with the inside surfaces of the permanent magnets 31 when the center bar 36 is inserted into the bores 35 of the permanent magnets 31.

The magnet holding member 38 is screwed on one end part of the center bar 36. Therefore, it is preferable that the length of the center bar 36 is longer than that of the tubular member 34 by a predetermined length. The center bar 36 is made of a nonmagnetic material, such as a stainless steel.

The magnet holding member 37 is set in contact with the end permanent magnet 31a at one end of the row of the plurality of permanent magnets 31 to restrain the end permanent magnet 31a from movement. The bracket 24 supporting the guide assembly 23 may serve also as the magnet holding member 37. When the bracket 24 is used also as the magnet holding member 37, an externally threaded attaching member 39 is projected from the end of the center bar 36, and a threaded hole 40 provided with an internal thread capable of engaging with the external thread of the attaching member 39 is formed in the bracket 24 as shown in FIG. 3. When the guide assembly 23 is attached to the bracket 24, an externally threaded end part may be formed on the center bar 36 and the tubular member 34 may be provided with an external thread. Thus, the magnet holding member 37 can be simply connected to the center bar 36. Preferably, a recess 41 is formed in the bracket 24 and the end of the guide assembly 23 is seated on the bottom surface of the recess 41.

The magnet holding member 38, namely, the pressing member, applies pressure to the end permanent magnet 31b at the other end of the row of the plurality of permanent magnets 31 so that the adjacent permanent magnets 31 are in close contact with each other.

For example, the magnet holding member 38 is an internally threaded member provided with an internal thread on the side surface of its center bore, such as an internally threaded nut or ring. An external thread is formed on an end part of the center bar 36, opposite the end part on which the magnet holding member 37 is mounted, and the magnet holding member 38, namely, the nut, is screwed on the externally threaded end of the center bar 36. Thus the magnet holding member 38 can be simply attached to the center bar 36.

A method of assembling the stator assembly 22 will be described by way of example. The externally threaded attaching member 39 projecting from the end of the center bar 36 is screwed in the threaded hole 40 to attach the center bar 36 to the bracket 24. The tubular member 34 is put on the center bar 36 and one of the opposite end parts of the tubular member 34 is fitted in the recess 41 formed in the bracket 24. Thus, the center bar 36 and the tubular member 34 are combined to form an annular space.

Then, the predetermined number of the annular permanent magnets 31 are fitted in the annular space defined by the tubular member 34 and the center bar 36 through the open end of the other end part of the tubular member 36 such that the respective polarities of the adjacent permanent magnets 31 are opposite to each other. Since the permanent magnets 31 are arranged so that the magnetic poles of the same magnetic polarity are contiguous, a repulsion acts between the adjacent permanent magnets 31. The permanent magnets 31 are pressed into the tubular member 34 against the repulsion. After the last permanent magnet 31b has been pressed into the tubular member 34, the magnet holding member 38, such as a nut, is screwed on the center bar 36 to force the permanent magnet 31 toward the bracket 24. Consequently, the permanent magnets 31 axially arranged in the tubular member 34 are pressed together so as to be in close contact with each other against the repulsion acting between the adjacent permanent magnets 31. Then, a cap 42 is put on the other end part of the tubular member 34 to close the open end of the tubular member 34.

The end part, closed by the cap 42, of the tubular member 34 is inserted into the through hole 30 of the moving member 21 to put the moving member 21 on the tubular member 34 (the guide assembly 23). Then, the other bracket 25 is attached to the end part of the tubular member 34. The stator assembly 22 combined with the moving member 21 is placed at a predetermined position on the base 11 as shown in FIG. 1. Bolts are passed through holes 43 (FIG. 3) and screwed in threaded holes formed in the base 11 to fix the brackets 24 and 25 to the base 11.

Thus, the linear servomotor included in the motor unit 4 is fixedly set on the base 11 to complete the motor unit 4 of the coating apparatus 10.

When the coating apparatus 10 is used to coat the substrate 1 with the organic EL material, the substrate 1 is fixedly mounted on the table 20 of the substrate support stage unit 2. The coating unit 3 (the position of the nozzle 18) is positioned beforehand at a position suitable for forming a desired organic layer.

Subsequently, the motor unit 4 including the linear servomotor is driven to slide the substrate support stage unit 2 under the coating unit 3 and, at the same time, the coating unit 3 discharges a desired organic EL material at a predetermined discharge rate through the nozzle 18 onto the sliding substrate 1.

Thus the organic EL material is spread on the substrate 1 to form an organic layer. The linear servomotor of the motor unit 4 is so controlled as to slide the substrate 1 at a fixed sliding speed, and the discharge unit 3 is so controlled as to discharge the organic EL material at a fixed discharge rate. For example, the encoder 28 is placed on the base 11 and a flowmeter is placed in a supply line connecting the material supplying device to the coating unit 3. The sliding speed of the moving member 21 and the discharge rate at which the organic EL material is discharged are controlled on the basis of data provided by the encoder 28 and the flowmeter.

Thus the coating apparatus 10 can form the organic layer (EL layer) having a uniform thickness on the substrate 1 by spreading the organic EL material on the substrate 1.

The linear servomotor of the motor unit 4 for sliding the substrate support stage unit 2 has the plurality permanent magnets 31 axially arranged in the tubular member 34 such that the respective polarities of the adjacent permanent magnets 31 are opposite to each other. The permanent magnets 31 are pressed together by pressing the permanent magnet 31b toward the bracket 24 by the magnet holding member 38, such as a nut, so that the adjacent permanent magnets 31 are in close contact with each other. Therefore, the substrate 1 (the moving member 21) can be slid at a fixed sliding speed.

The generally known linear motor is provided with a plurality of linearly arranged permanent magnets, and the adjacent permanent magnets are adhesively bonded together. Since the permanent magnets are arranged such that the respective polarities of the adjacent permanent magnets are opposite to each other, it is difficult to adhesively bond the adjacent permanent magnets together in close contact with each other and gaps are formed between the permanent magnets. Even if the plurality of permanent magnets are bonded together in close contact with each other, gaps are liable to develop between the permanent magnets due to repulsion acting between the adjacent permanent magnets as the linear motor is used repeatedly. If gaps are formed between the adjacent permanent magnets, positional accuracy of the permanent magnets deteriorates and hence the moving member cannot be slid at a fixed sliding speed. Since the component organic layers of the EL layer have very small thicknesses in the range of, for example, 5 nm to 10 µm, even a small thickness irregularity can be a large thickness error. Such large thickness errors are capable of causing irregular luminescence. In other words, the generally known linear motor cannot meet a required accuracy and linear motors capable of operating in higher accuracy have been desired.

In the coating apparatus 10 of the present invention, the plurality of permanent magnets 31 are pressed together in close contact with each other by pressure so that any gaps may not be formed between the adjacent permanent magnets 31. Consequently, the permanent magnets 31 can be arranged at a high positional accuracy and hence the substrate support stage unit 2 can slide at a satisfactorily constant sliding speed. Since the substrate 1 thus moves at a fixed sliding speed, thickness errors in the organic layer are 2% or below and 0.5% or below for organic layers of some types of organic electronic materials. Thus, an organic layer (the EL layer 6) having a uniform thickness can be formed on the substrate 1.

The coating apparatus 10 of the present invention is capable of forming the EL layer 6 having a smooth surface and a uniform thickness on the order of nanometers by a wet process on a surface of a comparatively large substrate. The coating apparatus 10 of the present invention has an excellent effect as compared with that of the conventional coating apparatus in forming the EL layer 6 of a thickness in the range of 10 to 1000 nm, particularly, in the range of 50 to 200 nm.

Since the stator assembly 22 including the plurality of permanent magnets 31 is stationary and the stator assembly 22 can be accurately positioned, the substrate 1 (the substrate support stage unit 2) can be surely slid at a constant sliding speed.

The plurality of permanent magnets 31 can be linearly arranged on the center by passing the center bar 36 successively through the bores of the cylindrical permanent magnets 31, which improves the facility of assembling work.

The plurality of permanent magnets 31 can be easily arranged in the nonmagnetic tubular member 34 by simply inserting the permanent magnets 31 into the annular space defined by the tubular member 34 and the center bar 36, which further improves the facility of assembling work.

The permanent magnets 31 have the shape of a ring and the ring-like permanent magnets are held in the tubular member 34 and the inside diameter of the tubular member 34 is determined so that the ring-like permanent magnets 31 may be in close contact with the inside surface of the tubular member 34. Therefore, the plurality of permanent magnets 31 are prevented from forming steps and hence the constancy of the sliding speed of the substrate 1 (the substrate support stage unit 2) can be improved. Consequently, the stability of the constant sliding speed of the substrate 1 (the substrate support stage unit 2) is improved and the organic layer (the EL layer 6) can be formed in a further uniform thickness.

The coating apparatus 10 of the present invention is capable of forming the EL layer 6 of the organic EL material, namely, the organic electronic material, having an excellently smooth surface and a uniform thickness. Therefore, the coating apparatus 10 of the present invention is capable of forming semiconductor layers and insulating layers each having a excellently smooth surface and a uniform thickness for organic thin-film transistors, and electrode layers and semiconductor oxide layers (power generating layers, namely, porous films) for solar cells each having an excellently smooth surface and a uniform thickness by using other organic electronic materials, such as materials for forming organic thin-film transistors and those for forming solar cells.

Materials for forming organic thin-film transistors are, for example, materials for forming organic EL devices, such as polyfluorene derivatives and polythiophene derivatives. More concretely, materials for forming organic thin-film transistors are semiconductor layer forming materials, such as polyethylene vinylenes, poly-3-hexyl thiophenes and 9,9-dioctylfluorene-bithiophenes, and insulating layer forming materials, such as polyvinyl phenols and polyhydroxy styrenes.

Materials for forming solar cells are electrode materials, such as platinum paste, and power generating materials, such as a titanium oxide colloid prepared by dispersing $TiO_2$ particles (titanium oxide particles) in an organic solvent, such as polyethylene glycol. Preferably, the $TiO_2$ particles (the titanium oxide particles) have particle sizes in the range of 1 to 100 nm.

A method of fabricating an organic electronic device, such as an organic EL device, using the coating apparatus of the present invention will be described.

An electrode film of an electrode material, such as a transparent ITO film of ITO (indium titanium oxide), is formed on a surface of a glass substrate 1. The electrode film is formed by, for example, a vacuum sputtering process, a vacuum evaporation process or a coating process using a coating solution. The coating apparatus 10 of the present invention may be employed in forming the first electrode film by a coating process.

The ITO film formed on the glass substrate 1 is patterned by, for example, photolithography to form a first electrode layer consisting of a plurality of first electrode stripes 7.

An insulating film of an insulating material is formed on an area, excluding areas coated with the first electrode stripes 7, on the surface of the glass substrate 1. The insulating film may be formed by a photolithographic process, a suitable film-forming process or a coating process using the coating apparatus 10 of the present invention.

Then, an organic EL material is discharged onto the first electrode stripes 7 by the coating apparatus 10 of the present invention to form an organic EL layer 6 of the organic EL material on the striped first electrode layer 7.

A coating process for coating the first electrode stripes 7 with the organic EL material forms read, green and blue organic EL layers of red, green and blue organic EL materials in that order. Preferably, the coating unit 3 of the coating apparatus 10 is provided with three nozzles 18 that discharge the red, the green and the blue organic EL material, respectively. The red, the green and the blue organic EL material may be simultaneously discharged through the three nozzles 18 to form the three organic EL layers in one sliding cycle of the substrate 1.

After the EL layers 6 have been formed, second electrode stripes 8 perpendicular to the first electrode stripes 7 are formed by forming a second electrode film of an electrode material by the coating apparatus 10 of the present invention and patterning the second electrode layer. The second electrode film may be formed by, for example, a vacuum sputtering process, a vacuum evaporation process or a coating process using a coating solution. The coating apparatus 10 of the present invention may be employed in forming the second electrode film by a coating process.

An organic EL device 5 thus fabricated has an XY matrix formed by the first electrode stripes 7 and the second electrode stripes 8. The organic EL device 5 is capable of displaying full-color pictures.

The first electrode layer forming the first electrode stripes 7, the EL layer 6 and the second electrode film of the second electrode stripes 8 of the organic EL deice 5 are formed by the coating apparatus of the present invention. Each of the first electrode strips 7, the EL layer 6 and the second electrode stripes 8 has a uniform thickness including a thickness error of 2% or below. The organic layers of the EL layer 6 have each a very small thickness in the range of 5 nm to 10 μm and therefore even small thickness irregularities in the organic layers of the EL layer 6 might be large thickness errors that will cause irregular luminescence. According to the present invention, the organic EL device 5 is free from such a problem and can display pictures in a uniform luminance.

Accordingly, the organic EL device 5 can be used for fabricating an EL display capable of displaying pictures in a uniform luminance.

Although the invention has been described as applied to the method of fabricating the organic EL device using the coating apparatus of the present invention. The present invention is applicable to fabricating other organic electronic devices, such as organic thin-film transistors and solar cells. When the coating apparatus 10 is used for forming, for example, an active semiconductor layer for an organic thin-film transistor, the active semiconductor layer having an excellently smooth surface and a uniform thickness having a thickness error of 2% or below can be formed. Thus an organic thin-film transistor having an excellent amplifying characteristic can be fabricated. The coating apparatus 10 of the present invention can be used for forming a back electrode layer and a semiconductor oxide layer (porous film) for a solar cell in a high surface smoothness and in a uniform thickness having a thickness error of 2% or below. Thus a solar cell having a high photoelectromotive force can be fabricated.

EXAMPLES

Further specific description of the present invention will be made in connection with examples of the present invention and comparative examples.

Coating Apparatuses
Coating Apparatus A
Discharge device: Ink-jet head
Motor unit: Linear servomotor
Moving element of motor unit: Substrate supporting stage
Coating Apparatus B
Discharge device: Dispenser nozzle
Motor unit: Linear servomotor
Moving element of motor unit: Substrate supporting stage
Coating apparatus C
Discharge device: Die head
Motor unit: Linear servomotor
Moving element of motor unit: Substrate supporting stage
Coating Apparatus D
Discharge device: Knife coater with doctor knife
Motor unit: Linear servomotor
Moving element of motor unit: Substrate supporting stage
Coating Apparatus E
Discharge device: Knife coater with doctor knife
Motor unit: Linear servomotor
Moving element of motor unit: Coating head
Coating Apparatus F
Discharge device: Knife coater with doctor knife
Motor unit: Linear motor
Moving element of motor unit: Substrate supporting stage
Coating Apparatus G
Discharge device: Knife coater with doctor knife
Motor unit: Ball screw
Moving element of motor unit: Substrate supporting stage The coating apparatuses A to E are examples of the coating apparatus of the present invention. The following permanent magnets, center bars and pipes were employed in the coating apparatuses A to E.

Figure 8A:
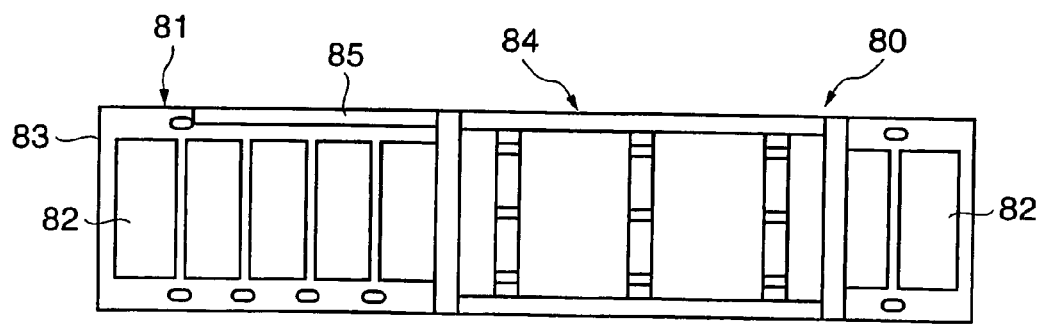
FIG. 8A is a plan view of a conventional coating apparatus.
Figure 8B:
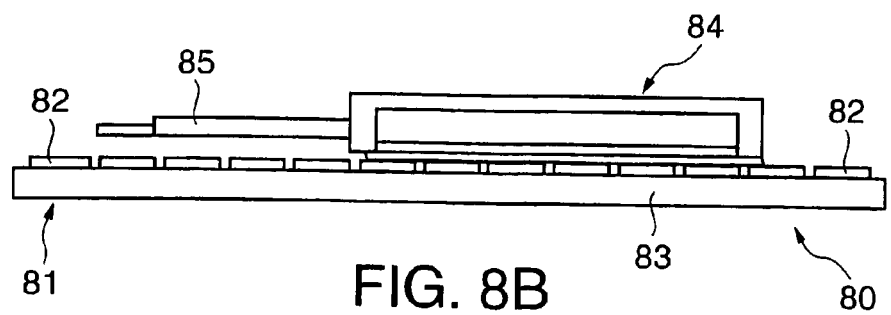
FIG. 8B is a side elevation of a conventional coating apparatus.

Permanent Magnet
  Shape: Cylindrical, Inside diam.: 11 mm, Outside diam.: 30 mm, Length: 60 mm, Number: 10, Material: Nd—Fe—B
Center Bar
  Shape: Cylindrical, Diam.: 10 mm, Length: 680 mm, Material: Stainless steel
Pipe
  Shape: Cylindrical, Inside diam.: 30 mm, Outside diam.: 32 mm, Length: 700 mm, Wall thickness: 1 mm, Material: Stainless steel As shown in FIGS. 8A and 8B, the coating apparatus F (the coating apparatus 80) was provided with fifteen magnets 82 having the shape of a rectangular parallelepiped of 50 mm in length, 30 mm in width and 5 mm in thickness. The fifteen magnets were arranged in a row such that opposite magnetic polarities of the magnets alternately change and were attached adhesively to a stationary member 83 to form a stator assembly 81. A moving member 84 provided with coils is guided by a cable 85 for movement above the stator assembly 81 along the row of the magnets 82.

The coating apparatus G was provided with a ball screw including a threaded rod of 20 mm in diameter and provided with a thread having a lead of 6 mm.

TABLE 1

| | Substrate support stage unit | Coating unit | |
|---|---|---|---|
| Coating apparatus A | Linear servomotor | Ink-jet head | Stationary |
| Coating apparatus B | Linear servomotor | Dispenser nozzle | Stationary |
| Coating apparatus C | Linear servomotor | Die head | Stationary |
| Coating apparatus D | Linear servomotor | doctor knife | Stationary |
| Coating apparatus E | Stationary | doctor knife | Linear servomotor |
| Coating apparatus F | Linear motor | doctor knife | Stationary |
| Coating apparatus G | Ball screw | doctor knife | Stationary |

Substrate

A transparent, conductive film of indium titanium oxidation (ITO) was formed on surfaces of transparent glass substrates of 150 mm in length, 150 mm in width and 1.1 mm in thickness by a sputtering process. The ITO films were patterned to form the following substrates A and B.

Substrate A

A peripheral part of 10 mm in width of the ITO film was removed by an etching process to pattern the ITO film in a pattern of 140 mm×140 mm.

Substrate B

Linear gaps of 100 μm in width were formed at intervals of 100 μm in the ITO film patterned in a pattern of 140 mm×140 mm to form a striped pattern of ITO stripes of 100 μm in width. Resist stripes of 120 μm in width of a resist were formed in the gaps so as to cover side edges of the ITO stripes of the striped pattern.

Coating Solution

Three types of luminescent coating solutions (organic EL materials) were prepared by dissolving a polyvinyl carbazole having the chemical formula 1, luminescent dyes and an oxadiazole compound having the chemical formula 2 in toluene in the following compositions. The luminescent dies were selected to provide luminescent coating solutions that emit green light, red light and blue light, respectively. Coumarin 6 having the chemical formula 3, Nile red having the formula 4 and a perylene compound having the chemical formula 5 were used.

Coating Solution G
Polyvinyl carbazole: 7 parts by weight
Luminescent dye: Coumarin, 0.1 parts by weight
Oxadiazole compound: 3 parts by weight
Toluene: 5010 parts by weight Coating Solution R
Polyvinyl carbazole: 7 parts by weight
Luminescent dye: Nile red, 0.1 parts by weight
Oxadiazole compound: 3 parts by weight
Toluene: 5010 parts by weight Coating Solution B
Polyvinyl carbazole: 7 parts by weight
Luminescent dye: Perylene compound, 0.1 parts by weight
Oxadiazole compound: 3 parts by weight
Toluene: 5010 parts by weight

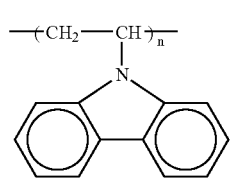

Chemical formula 1

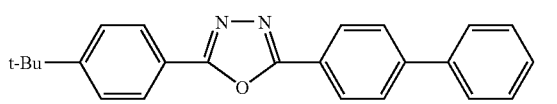

Chemical formula 2

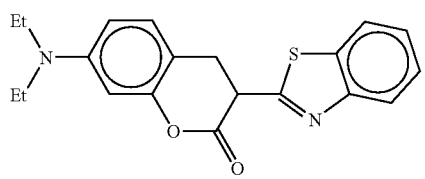

Chemical formula 3

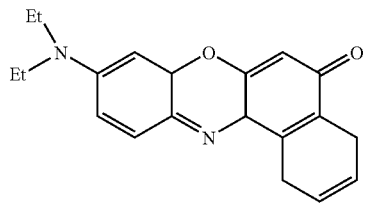

Chemical formula 4

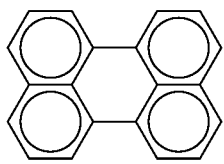

Chemical formula 5

Example 1

The substrate B was cleaned by an ultrasonic cleaning apparatus using acetone, isopropanol and pure water and then, the ITO stripes were irradiated with UV rays. Then, the ITO stripes were coated with a film of the coating solution G of the luminescent material by the coating apparatus A under the following coating conditions.

Coating Conditions
Moving speed of the substrate: 5 to 200 mm/s
Luminescent solution discharge rate: 4 μl/s to 300 ml/s
Nozzle-substrate distance: 0.1 to 50 μm The luminescent film formed on the substrate B was dried at 80° C. for 30 min in an oven to form an EL layer of a single 100 mm thick luminescent film. Thickness of the EL layer was measured by a table probe microscope (Seiko Instrument) to determined thickness distribution. Thickness errors in a central portion of 140 mm×140 mm of the EL layer were 2% or below and irregularities in the EL layer were 5 nm or below.

A 150 nm thick second electrode film of an MgAg alloy (Mg:Ag=10:1) was formed on the EL layer by an evaporation process. A 200 nm thick Ag film, namely, a protective layer, was formed on the second electrode layer by an evaporation process to complete an organic EL device.

The ITO electrode and the MgAg electrode of the organic EL device were connected to a positive electrode and a negative electrode, respectively. A dc current was supplied to the organic EL device by a source meter. The organic EL device emitted light when a voltage of 10 V was applied thereto. Light emitted by the organic EL device was measured as a function of wavelength by a spectrophotometer (IMUC 700G, Ohtsuka Denshi). The organic EL device emitted green light coming from coumarin 6 and having a peak wavelength of 501 nm in a uniform surface-area luminance.

Example 2

An organic EL device in Example 2 was fabricated by a method similar to the fabricating method of the organic EL device in Example 1, except that the coating apparatus B was used. Thickness errors in a central portion of 140 mm×140 mm of the EL layer were 2% or below and irregularities in the EL layer were 5 nm or below. The organic EL device emitted green light coming from coumarin 6 and having a peak wavelength of 501 nm in a uniform surface-area luminance.

Example 3

An organic EL device in Example 3 was fabricated by a method similar to the fabricating method of the organic EL device in Example 1, except that the substrate A and the coating apparatus C were used. Thickness errors in a central portion of 140 mm×140 mm of the EL layer were 2% or below and irregularities in the EL layer were 5 nm or below. The organic EL device emitted green light coming from coumarin 6 and having a peak wavelength of 501 nm in a uniform surface-area luminance.

Example 4

The substrate A was placed on a stage and the doctor knife of the coating apparatus D was placed on the substrate A. The coating solution, namely, the luminescent material, was poured along the doctor knife on the substrate A. The stage was moved to spread the coating solution over the substrate A to form a film of the coating solution. The film of the coating solution was dried at 80° C. for 30 min in an oven to form an EL layer of a single 100 nm thick luminescent film. Thickness of the EL layer was measured by a table probe microscope (Seiko Instrument) to determined thickness distribution. Thickness errors in a central portion of 140 mm×140 mm of the EL layer were 2% or below.

A 150 nm thick second electrode film of an MgAg alloy (Mg:Ag=10:1) was formed on the EL layer by an evaporation process. A 200 nm thick Ag film, namely, a protective layer, was formed on the second electrode layer by an evaporation process to complete an organic EL device.

The ITO electrode and the MgAg electrode of the organic EL device were connected to a positive electrode and a negative electrode, respectively. A dc current was supplied to the organic EL device by a source meter. The organic EL device emitted light when a voltage of 10 V was applied thereto. Light emitted by the organic EL device was measured as a function of wavelength by a spectrophotometer (IMUC 700G, Ohtsuka Denshi). The organic EL device emitted green light coming from coumarin 6 and having a peak wavelength of 501 nm in a uniform surface-area luminance.

Example 5

A organic EL device was fabricated by a method similar to the fabricating method of the organic EL device in Example 4, except that the coating apparatus E was used and the doctor knife was moved, instead of using the coating apparatus D and moving the stage on which the substrate A. The EL layer of the organic EL device in Example 5, similarly to that of the organic EL device in Example 4, had thickness errors of 2% or below in a central portion of 140 mm×140 mm of the EL layer. The organic EL device emitted clearly separated three colors in a uniform surface-area luminance.

Example 6

An area-color organic EL device was fabricated by a method similar to the fabricating method of the organic EL device in Example 3, except that the coating solutions G, R and B, namely, luminescent solutions, were applied sequentially to the substrate B in the moving direction of the stage of the coating apparatus C. The EL layer of the organic EL device in Example 5, similarly to that of the organic EL device in Example 4, had thickness errors of 2% or below in a central portion of 140 mm×140 mm of the EL layer. The organic EL device emitted clearly separated three colors in a uniform surface-area luminance.

Comparative Example 1

An organic EL device in Comparative example 1 was fabricated by a method similar to the fabricating method of the organic EL device in Example 4, except that the coating apparatus F was used. The EL layer of the organic EL device had thickness errors of 5% in a central portion of 140 mm×140 mm of the EL layer. Luminance irregularities in the organic EL device could be visually recognized.

Comparative Example 2

An organic EL device in Comparative example 2 was fabricated by a method similar to the fabricating method of the organic EL device in Example 4, except that the coating apparatus G was used. The EL layer of the organic EL device had thickness errors of 10% in a central portion of 140 mm×140 mm of the EL layer. The organic EL device emitted light in a striped luminance pattern of luminous stripes of different luminances. The pitch of the luminous stripes corresponded to that of the ball screw.

Example 7

Figure 9:
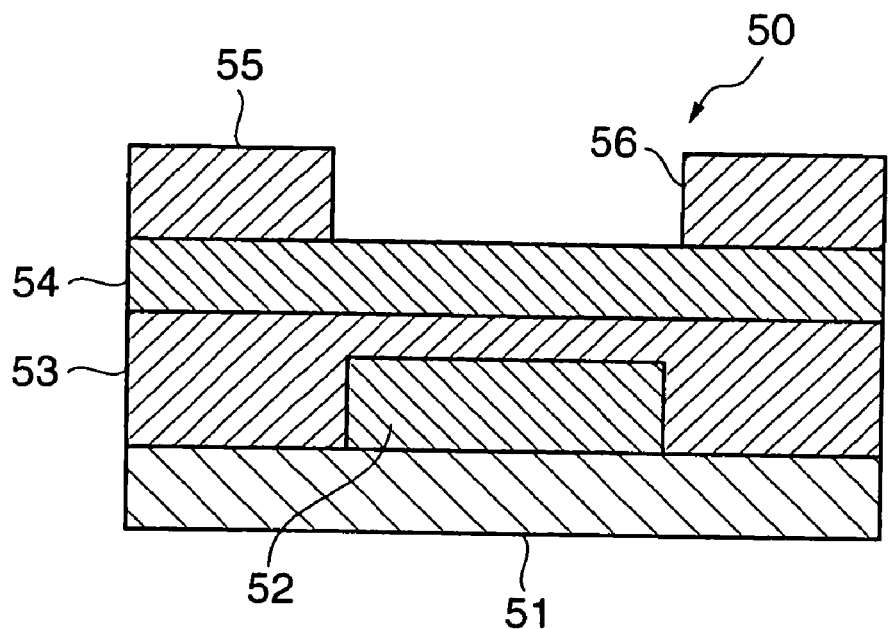
FIG. 9 is a schematic sectional view of an organic thin-film transistor.

As shown in FIG. 9, a gate electrode 52 was formed by patterning a gold film formed on a substrate 51 of quartz glass. A 1000 Å thick insulating film 53 of silicon nitride was formed over the gate electrode 52 by a sputtering process. An active semiconductor layer of 1000 Å in dry thickness was formed by spreading a polythiophene derivative on the insulating film 53 by the coating apparatus D. A source electrode 55 and a drain electrode 56 spaced by a distance of 100 µm were formed by depositing gold by an evaporation process to complete an organic thin-film transistor 50.

Thickness of the active semiconductor layer, similarly to the EL layers of Examples 1 to 6, was measured by a table probe microscope (Seiko Instrument) to determined thickness distribution. Thickness errors in a central portion of 140 mm×140 mm of the EL layer were 2% or below and irregularities in the EL layer were 5 nm or below.

A fixed voltage was applied to the gate electrode 56 of the organic thin-film transistor 50 thus fabricated by a picoammeter (4140B, Hewlett-Packard Co.) and voltages in the range of −15 to 15 V were applied between the source electrode 55 and the drain electrode 56. A distinct saturation current could be recognized. The saturation current varied according to the gate voltage. The organic thin-film transistor 50 had an amplifying characteristic.

Example 8

Figure 10:
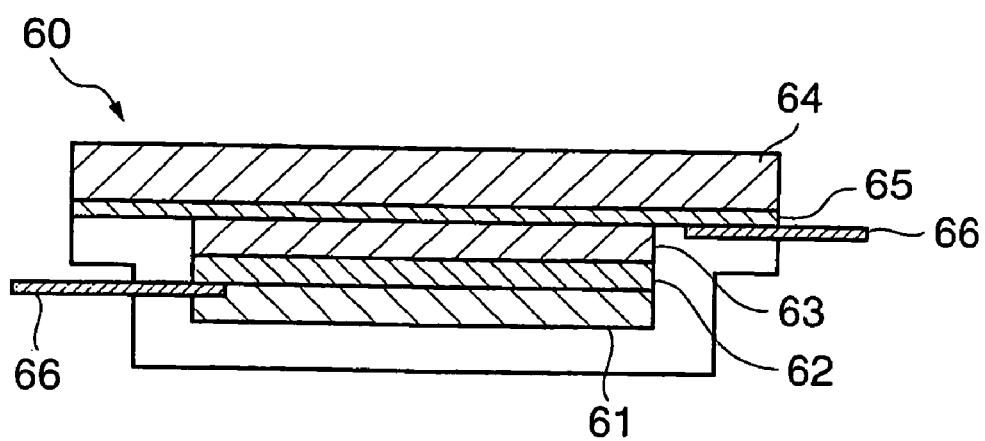
FIG. 10 is a schematic sectional view of a solar cell.

As shown in FIG. 10, a patterned film of a platinum paste was formed on a back substrate 61, namely, a glass substrate, by the coating apparatus B and the patterned film was dried to form a 3 µm thick back electrode layer 62. A patterned film of a coating solution prepared by dispersing $TiO_2$ particles of particle sizes in the range of 1 to 10 nm in polyethylene glycol was formed by the coating apparatus B. The patterned film was subjected to predrying, and then the predried patterned film was dried and backed at 450° C. for 30 min to form a 10 µm thick semiconductor oxide film (power generating layer, namely, porous film) 63.

Thicknesses of the back electrode layer 62 and the semiconductor oxide film 63 were measured by the table probe microscope (Seiko Instrument) mentioned in the description of Examples 1 to 6 to determined thickness distribution. Thickness errors in a central portion of 140 mm×140 mm of each of the back electrode layer 62 and the semiconductor oxide film 63 were 2% or below and irregularities in each of the back electrode layer 62 and the semiconductor oxide film 63 were 5 nm or below.

A color sensitizer was added to the semiconductor oxide film 63 of a laminated structure constructed by forming the back electrode layer 62 and the semiconductor oxide film 63 on the back substrate 61 by immersing the laminated structure in an ethanol solution of a ruthenium complex to impregnate the semiconductor oxide film 63, namely, the porous film, with a color sensitizer and drying the laminated structure. Then, another laminated structure constructed by forming a patterned $SnO_2$ thin film 65, namely, a transparent electrode layer, on a glass plate 64, namely, a transparent substrate, was joined to the former laminated structure with the patterned $SnO_2$ thin film 65 in contact with the semiconductor oxide film 63 to form a cell structure. Leads 66 were connected to the cell structure. The cell structure was sealed in a coat of an epoxy adhesive provided with an electrolyte pouring hole. An iodized electrolyte was poured through the electrolyte pouring hole into the coat after the coat of the epoxy adhesive has set and the electrolyte pouring hole was sealed to complete a color-sensitized solar cell 60.

Measured photoelectric conversion efficiency η (%) of a solar battery constructed by connecting the thus fabricated solar cells 60 was 9%, which proved that the solar battery had satisfactory photoelectromotive force.

The coating apparatus according to the present invention for coating a workpiece with an organic electronic material includes the motor unit formed by linearly arranging the plurality of permanent magnets such that opposite magnetic polarities of the magnets alternately change, and linearly pressing the permanent magnets together so that the adjacent permanent magnets are in close contact with each other. Therefore, the substrate support stage unit and the coating unit can be slid at fixed sliding speeds, respectively. Thus an organic layer having a uniform thickness can be formed on a substrate by discharging an organic electronic material onto the substrate while the substrate support stage unit and the coating unit are sliding.

The method of fabricating an organic electronic device according to the present invention capable of forming an organic layer having a uniform thickness on a substrate can form an organic electronic device having satisfactory characteristics.

The invention claimed is:

1. A coating apparatus comprising:
   a base;
   a substrate support stage unit mounted on the base and capable of fixedly supporting a substrate;
   a coating unit mounted on the base and capable of discharging a coating material onto a substrate fixedly supported on the substrate support stage unit; and
   a motor unit for driving at least either of the substrate support stage unit or the coating unit for sliding on the base;
   wherein the motor unit includes a plurality of magnets linearly arranged such that opposite magnetic polarities of the magnets alternately change, and a pair of magnet holding members for linearly pressing the magnets together from both the ends of the magnets, and
   wherein the motor unit includes a stator assembly fixedly mounted on the base, and a slide assembly that slides in opposite directions along the stator assembly, and the plurality of magnets are included in the stator assembly, the slide assembly is fixed to a center portion of the substrate support stage unit or the coating unit, and has a through hole through which the plurality of magnets pass,
   a pair of guide members are provided at both side edges of the substrate support stage unit or the coating unit, each positioned on the both sides with respect to the slide assembly, and
   a pair of guide supporting supports, which support the corresponding guide members, provided on the base.

2. The coating apparatus according to claim 1, wherein the slider assembly is internally provided with a plurality of coils.

3. The coating apparatus according to claim 1, wherein each of the magnets is a cylindrical magnet having a bore, and a nonmagnetic center bar is fitted in the bores of the cylindrical magnets.

4. The coating apparatus according to claim 3, wherein the pair of magnet holding members are a retaining member placed on a first end part of the center bar in contact with the adjacent magnet, and a pressing member placed on a second end part opposite the first end part of the center bar and pressing the adjacent magnet toward the retaining member.

5. The coating apparatus according to claim 4, wherein the pressing member is detachably attached to the second end part of the center bar.

6. The coating apparatus according to claim 4, wherein the plurality of magnets are surrounded by a nonmagnetic cylindrical member, the retaining member is placed on the first end part of the center bar corresponding to a first end of the cylindrical member, and the pressing member is placed detachably on the second end part of the center bar corresponding to a second end opposite the first end of the cylindrical member.

7. The coating apparatus according to claim 1, wherein the plurality of magnets are held in a nonmagnetic cylindrical member.

8. The coating apparatus according to claim 7, wherein the magnets are formed in an annular shape, and the cylindrical member is a cylindrical pipe having an inside surface in close contact with the outside surfaces of the annular magnets.

9. The coating apparatus according to claim 1, wherein the magnets are permanent magnets of a rare-earth metal or ferrite material.

10. The coating apparatus according to claim 1, wherein the coating unit is provided with an ink-jet head, a dispenser nozzle, a die head or a doctor knife.

11. The coating apparatus according to claim 1, wherein the coating material is an organic semiconductor material.

12. The coating apparatus according to claim 11, wherein the organic semiconductor material is an organic electroluminescent material, an organic material for forming thin-film transistors or a material for forming solar cells.

13. An organic electronic device fabricating method to be carried out by a coating apparatus including:
   a base;
   a substrate support stage unit mounted on the base and capable of fixedly supporting a substrate;
   a coating unit mounted on the base and capable of discharging a coating material onto a substrate fixedly supported on the substrate support stage unit; and
   a motor unit, for driving at least either of the substrate support stage unit or the coating unit for sliding on the base, the motor unit including a plurality of magnets linearly arranged such that opposite magnetic polarities of the magnets alternately change, and a pair of magnet holding members for linearly pressing the magnets together from both the ends of the magnets, and wherein the motor unit includes a stator assembly fixedly mounted on the base, and a slide assembly that slides in opposite directions along the stator assembly, and the plurality of magnets are included in the stator assembly, the slide assembly is fixed to a center portion of the substrate support stage unit or the coating unit, and has a through hole through which the plurality of magnets pass, a pair of guide members are provided at both side edges of the substrate support stage unit or the coating unit, each positioned on the both sides with respect to the slide assembly, and a pair of guide supporting supports, which support the corresponding guide members, provided on the base;

said organic electronic device fabricating method comprising the steps of:

forming an organic layer by coating the substrate with a coating material by the coating apparatus, and fabricating an organic electronic device.

14. The organic electronic device fabricating method according to claim 13, wherein the organic electronic device is an organic semiconductor device.

15. The organic electronic device fabricating method according to claim 14, wherein the organic semiconductor is an organic electroluminescence device, an organic thin-film transistor or a solar cell.

16. The organic electronic device fabricating method according to claim 13, wherein a thickness error in the organic layer is 2% or below.

17. The organic electronic device fabricating method according to claim 13, wherein the organic layer has a thickness in the range of 10 to 1000 nm.

* * * * *